United States Patent [19]

Maier et al.

[11] Patent Number: 4,621,279

[45] Date of Patent: Nov. 4, 1986

[54] NON-EVACUATED, RAPIDLY COOLABLE HOUSING FOR AN OPTO-ELECTRONIC SEMICONDUCTOR COMPONENT

[75] Inventors: Horst Maier, Heilbronn; Gottfried Pähler, Berlin, both of Fed. Rep. of Germany

[73] Assignee: Telefunken Electronic GmbH, Heilbronn, Fed. Rep. of Germany

[21] Appl. No.: 660,317

[22] Filed: Oct. 12, 1984

[30] Foreign Application Priority Data

Oct. 13, 1983 [DE] Fed. Rep. of Germany ....... 3337194

[51] Int. Cl.$^4$ ...................... F25B 19/00; H01L 23/50; H01L 23/46
[52] U.S. Cl. .................. 357/83; 62/514 JT; 250/352
[58] Field of Search ............ 62/514 R, 514 JT; 357/83; 250/352

[56] References Cited

U.S. PATENT DOCUMENTS

| | | | |
|---|---|---|---|
| 2,951,944 | 9/1960 | Fong | 250/352 |
| 3,495,419 | 2/1970 | Hart | 62/514 JT |
| 3,926,011 | 12/1975 | Sollami | 62/514 JT |
| 4,194,119 | 3/1980 | MacKenzie | 250/352 |
| 4,262,200 | 4/1981 | Guy | 250/352 |
| 4,451,735 | 5/1984 | Diedrich et al. | 250/352 |
| 4,474,036 | 10/1984 | Ball et al. | 62/514 R |
| 4,487,037 | 12/1984 | Meignin et al. | 250/352 |

FOREIGN PATENT DOCUMENTS

| | | |
|---|---|---|
| 2247845 | of 1973 | Fed. Rep. of Germany . |
| 3138521 | of 1983 | Fed. Rep. of Germany . |
| 2119071 | 11/1983 | United Kingdom ............ 62/514 JT |
| 0720266 | 3/1980 | U.S.S.R. .......................... 62/514 JT |
| 0779762 | 11/1980 | U.S.S.R. .......................... 62/514 JT |

OTHER PUBLICATIONS

Physics Today, Jan. 1982, pp. 96–97.
"Infrared Detectors for Military Applications," Mullard, Limited Publication 9398 305 40051, pp. 0–16.

Primary Examiner—James W. Davie
Assistant Examiner—Vangelis Economou
Attorney, Agent, or Firm—Spencer & Frank

[57] ABSTRACT

The invention relates to a housing for opto-electronic components, with the semiconductor component being cooled by a cooler which operates in accordance with the Joule-Thomson effect and is in communication with the housing. The gist of the invention is that the non-evacuation housing comprises several sections, with the first section of the housing which is in direct communication with the cooler having a low thermal conductivity and a low thermal capacity, whereas the end section of the housing containing a radiation transmitting window has a high thermal conductivity and a high thermal capacity.

20 Claims, 2 Drawing Figures

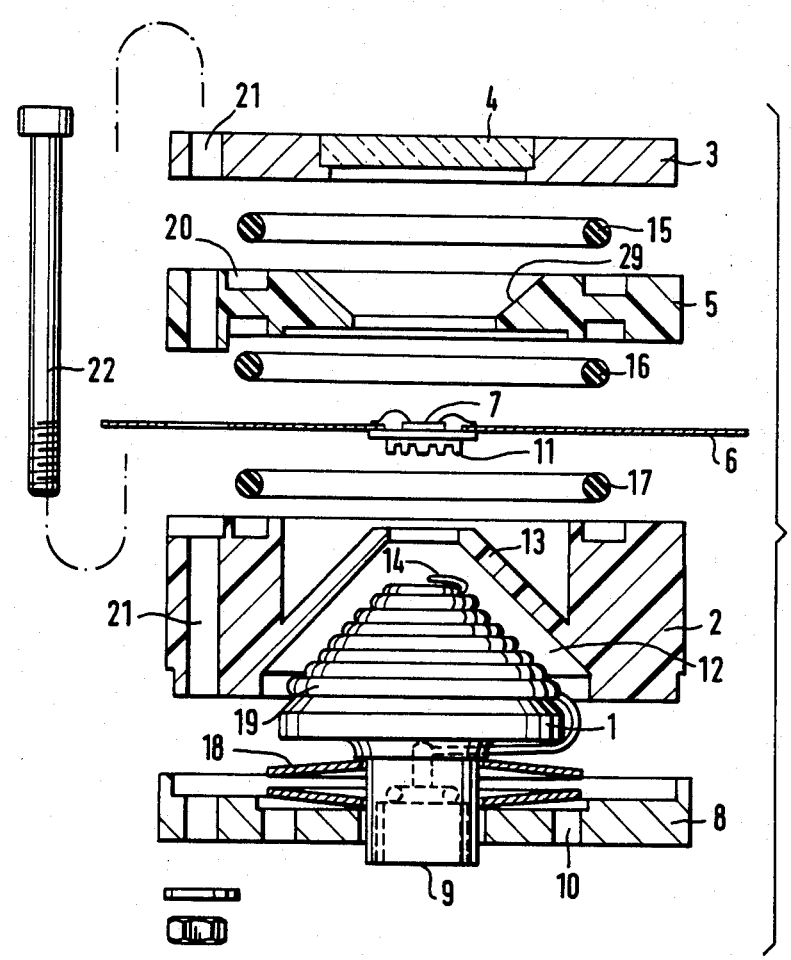
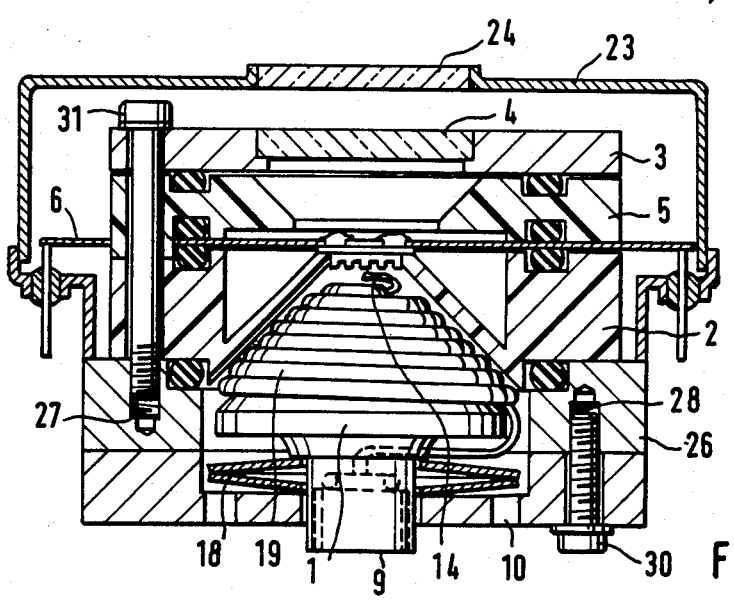

NON-EVACUATED, RAPIDLY COOLABLE HOUSING FOR AN OPTO-ELECTRONIC SEMICONDUCTOR COMPONENT

BACKGROUND OF THE INVENTION

The invention relates to a housing for an opto-electronic semiconductor component operable at low temperatures, with the housing being in communication with a cooler operating in accordance with the Joule-Thomson effect.

Certain semiconductor components have to be cooled down to low temperatures in order to attain their optimum performance data. This is particularly true for infrared sensitive detectors and infrared lasers. Typical operating temperatures of these semiconductor components are the boiling temperatures of nitrogen (77° K.), air (79° K.) or argon (87° K.).

The housing for such a detector generally consists of an evacuated double-walled container comprising a window for transmission of the infrared radiation and electric bushings for the current supply and/or the signal evaluation of the semiconductor component. The immediate surrounding area of the semiconductor component is cooled with a cooler operating in accordance with the Joule-Thomson principle, the Peltier principle or the Stirling principle.

With the known devices of this type it is possible to reach the required low operating temperatures within a few minutes. The operating time of the semiconductor component is unlimited as long as the cooling of the cooler employed continues to be effective. For certain applications, however, the comparatively slow cooling down of the semiconductor component is undesirable, and long maintenance of the operating temperature is not required. In these cases, rapid cooling down within, for example, less than ten seconds, is desired, while the maximum operating duration may be less than 1 to 5 minutes.

SUMMARY OF THE INVENTION

The object underlying the invention is to indicate a housing for a radiation sensitive semiconductor component which may be cooled down to the required operating temperature very rapidly, for example, within a few seconds, and with which the operating state need only be maintained for a short time.

According to the invention, this object is attained with a housing of the type described at the outset in that the non-evacuated housing comprises several sections, wherein the first section of the housing which is directly connected with the cooler exhibits low thermal conductivity and capacity, while the housing end section comprising a radiation transmitting window exhibits high thermal conductivity and capacity.

The invention is based on the realization that only as small as possible an area of the housing around the semiconductor component must be cooled. This area ought to be of such mass and material as to exhibit as low a thermal capacity as possible. A simplification and decrease in cost of the housing are achieved by it not being evacuated, but rather filled with air or a suitable gas. Hermetic sealing between the individual housing sections is necessary in order to exclude condensation of penetrating water vapor and corrosion of the semiconductor component. Cooling down of the outer surface of the inlet window below the dew point of the surrounding atmosphere should be avoided during the required operating time of less than 1 to 5 minutes. To this end, the window and the area surrounding the window exhibit high thermal capacity and thermal conductivity as regards mass and material.

The advantageous embodiments of the housing according to the invention for the radiation sensitive semiconductor component operable at low temperatures are apparent from the subclaims.

BRIEF DESCRIPTION OF THE DRAWINGS

The invention will now be explained in greater detail with reference to an embodiment example.

FIG. 1 shows the individual sections of the housing in a position suitable for assembly.

FIG. 2 shows the assembled housing which is also enclosed by a further stainless steel housing.

DESCRIPTION OF THE PREFERRED EMBODIMENT

The housing shown in FIG. 1 mainly consists of four sections which are held together by screws or threaded plugs 22. The housing section 2 serves to support the carrier plate 11 for the semiconductor component 7 and to accomodate the cooler 1 operating in accordance with the Joule-Thomson principle.

The housing end section 3 contains the radiation transmitting window 4 which is arranged in such a way that the infrared rays entering through the window hit the semiconductor component 7. An intermediate section 5 is arranged between the housing end section 3 and the housing section 2. The electric connection leads 6 are conducted outwardly in an insulated manner between this intermediate section and the housing section 2. The fourth section of the housing is formed by the bottom plate 8 which is likewise screwed to the remaining housing sections and presses the cooler 1 against the outside wall of the recess 12 provided to accommodate it in the housing section 2.

The cooler 1 operates according the Joule-Thomson principle and consists in a manner known per se of a conical or cylindrical hollow body with a pipe coil which is arranged on the casing surface and through which the cooling agent flows. The cone angle is generally between 0 and 90 degrees; a known cooler consisting of a 90° conical hollow body is shown in FIG. 1.

The cooling medium consisting of air, argon or nitrogen is fed into the pipe coil 19 through an inlet opening 9, flows through this pipe coil, and exits through the opening 14 directly opposite the carrier member 11 for the semiconductor component 7. The Joule-Thomson effect ensures that with expansion of the gas conducted through the pipe coil under high pressure, the gas cools down on exiting from the opening 14, so that the returning gas effects a pre-cooling of the gas flow following through the pipe coil. In this way, it is ensured that the exiting gas is liquefied only a few seconds later, with the result that the semiconductor component 7 is cooled down to the boiling temperature of the cooling medium. The bottom plate 8 contains outlet openings 10 for the returning gas. The bottom plate 8 also contains bores 21 by means of which this bottom plate is mechanically fixedly connected and hermetically sealed to the other sections of the housing by screws 22. During assembly, the cooler 1 is pressed against the outside wall 13 of the recess 12 adapted to the cone in the housing section 2 by the bottom plate 8 by means of springs, for example, Belleville springs 18. The bottom plate 8 is of stable design and may, for instance, consist of copper, another metal or plastics material.

The housing section 2 contains the recess 12 precisely adapted to the cone angle of the cooler 1, with a thin housing wall 13 which may be mechanically reinforced by means of suitable structures, for example, by means of webs or ribs. The recess 12 is closed off towards the housing interior by means of the carrier plate 11 for the semiconductor component 7. This plate 11 is made of a material of good thermal conductivity but low thermal capacity. Suitable materials are, for example, sapphire or molybdenum. The carrier plate 11 is adhered or soldered to the housing section 2 after prior metallization of the contact surfaces.

The housing section 2 contains groove 20 for a sealing ring 17 and bores 21 for the connecting screws 22.

The housing section 2 is made of a material with low thermal conductivity and low thermal capacity. A suitable material is, for example, polyimide plastic which may be filled with a foreign material reinforcement comprised of glass fibers or teflon. Other materials such as glass, metal or ceramics are also suited to meet the aforementioned thermal conditions.

Section 5 is an intermediate plate with a central opening 29 for the path of rays.

This intermediate plate 5 is sealed off from the housing section 2 and the housing end section 3 by means of sealing rings 16 and 15 which are inserted into grooves 20. Like the sealing ring 17, these sealing rings 15 and 16 preferably consist of rubber or indium. The intermediate section 5 is made of a sufficiently stable and resistant material, more particularly, of the same material as the housing section 2. The housing end section 3 contains the window 4 which may also be in the form of a lens, and consist, for example, of sapphire or germanium and have an antireflection coating. The material surrounding the window has a high thermal capacity as well as a high thermal conductivity. It consists, for example, of copper. Another suitable material is Kovar whose expansion coefficient is well adapted to most window materials, ensuring that the sections can be soldered to each other firmly and enduringly. The high thermal conductivity and thermal capacity of the housing end section 3 ensure that the window 4 does not fog up during the brief time of operation.

Thin, narrow metal foil strips 6 arranged radially are used for the electric current supply and/or signal evaluation. If the sealing rings 16 and 17 are made of a conductive material, the metal foils must be insulated on both sides. The insulation may, for example, consist of a polyimide coating. A so-called superinsulation may be arranged between the pipe coil 19 and the housing section 2 in the housing according to FIG. 1. This superinsulation preferably consists of a thin, single- or multi-layered foil made, for example, of polyimide. This makes for a further improvement of the heat insulation as compared to the housing section 2, with the result that the returning gas following its spiral-shaped path between the housing section 2 and the pipe coil 19 to the gas outlet port 10 effects an improved pre-cooling of the gas flowing through the pipe coil.

According to FIG. 2 the multi-sectioned housing for the detector component according to the invention may be built into an additional housing 23 if adverse environmental conditions, particularly high air humidity or aggressive vapors prevail. This housing 23 preferably is made of stainless steel and comprises a further window 24 which is located above the window 4 and permits transmission of infrared radiation. The electric leads 6 for the semiconductor component are also conducted through the second outer housing in a tight and electrically insulated manner.

The outer housing 23 may be screwed or soldered to the housing section 2 of the inner housing. To this end, the outer housing comprises a bottom plate 26 which is tightly and mechanically fixedly connected to the underside of the housing section 2. The bottom plate 8, which also holds the cooler 1, may then be rigidly connected to this bottom plate 26 of the outer housing. For screwing the sections to each other, the bottom plate 26 of the outer housing contains, for example, threaded blind holes 27 and 28 for the screws 30 and 31. The outer housing is also preferably not evacuated, but rather contains air or gas, for example, argon.

With the arrangement according to the invention, and a suitable choice of cooler, cooling times of the semiconductor component to the required operating temperature of under one second is attained. The possible operating time constituted values of more than five minutes.

What is claimed is:

1. Housing for an opto-electronic semiconductor component operable at low temperatures, with the housing being in communication with a cooler operating in accordance with the Joule-Thompson effect, wherein the housing in non-evacuated and filled with gas, and the housing comprises a first housing section (2) which is in direct communication with the cooler (1) and which has a low thermal conductivity and capacity, a housing end section (3) containing a radiation transmitting window (4), said housing end section having a high thermal conductivity and capacity, and a third housing section between said first housing section and said housing end section and tightly connected thereto, and electric leads for the semiconductor component being conducted between said first housing section and said third housing section.

2. Housing according to claim 1 in combination with an infrared radiation sensitive semiconductor component.

3. Housing according to claim 1, wherein the cooler comprises a cooling agent, the housing sections (2, 3, 5) are connected to a bottom plate (8) which simultaneously presses the cooler (1) against the first housing section (2) with a defined bearing pressure, and this bottom plate contains inlet and outlet openings (9, 10) for the cooling agent.

4. Housing according to claim 1, wherein the semiconductor component (7) is arranged on a plate (11) of high thermal conductivity held by the first housing section (2) and cooled by the cooler (1) and located opposite the window (4) in the housing end section (3).

5. Housing according to claim 1, characterized in that it is filled with air or gas.

6. Housing according to claim 1, wherein the semiconductor component is mounted in a carrier plate, the cooler comprises a cooling agent and a gas outlet opening for the cooling agent, and the cooler (1) is of conical or cylindrical design and fits into a correspondingly designed recess (12) in a thin-walled area (13) in the first housing section (2) in such a way that the gas outlet opening (14) for the cooling agent is arranged immediately underneath the carrier plate (11) for the semiconductor component (7).

7. Housing according to claim 6, wherein the thin-walled area (13) of the first housing section (2) is reinforced by stabilizing ribs or webs.

8. Housing according to claim 1, wherein the first and the third housing sections (2, 5) consist of a plastics material such as polyimide.

9. Housing according to claim 8, wherein the housing plastics material contains a filler such as glass fibers or teflon.

10. Housing according to claim 4, wherein the carrier plate (11) of the semiconductor component (7) and the housing end section (3) consist of a material which has a high thermal conductivity such as copper.

11. Housing according to claim 4, wherein the carrier plate (11) for the semiconductor component (7) consists of a material of high thermal conductivity and low thermal capacity such as sapphire or molybdenum.

12. Housing according to claim 6, wherein the housing sections (2, 3, 5) are tightly connected to one another by rubber rings or indium rings (15–17).

13. Housing according to claim 1, wherein the electric leads for the semiconductor component (7) comprise narrow, radially arranged, conductive foils (6), and these leads are conducted out between two housing sections (2, 5) in an electrically insulated manner.

14. Housing according to claim 13, comprising conductive sealing rings between the first and third housing sections, and wherein the conductive foils are insulated on both sides from the conductive sealing rings.

15. Housing according to claim 6, wherein the recess (12) in the first housing section (2) for accomodation of the cooler has an aperture angle between $0 < \alpha \leq 90°$.

16. Housing according to claim 3, wherein the bottom plate (8) presses the cooler (1) against the first housing section (2) by means of springs (18).

17. Housing according to claim 3, wherein a pipe coil (19) for the cooling gas is arranged on the cone of the cooler, and this pipe coil is pressed against the outside wall of the first housing section (2) in such a way that the returning gas flows in a likewise spiral-shaped path to the gas outlet (10) in the bottom plate (8).

18. Housing according to claim 17, characterized in that a superinsulation is arranged between the pipe coil (19) and the first housing section (2) and consists of a thin single- or multi-layered coil.

19. Housing according to claim 1, wherein all of the housing sections are screwed to one another.

20. Housing according to claim 1, wherein the multi-sectioned housing is built into a further hermetically sealed housing (23) of stainless steel containing above the first radiation transmitting window in the housing end section a further radiation transmitting window (24).

* * * * *